United States Patent [19]

Sporck

[11] 4,043,969
[45] Aug. 23, 1977

[54] CASTING COMPOUND FOR SEMICONDUCTOR DEVICES

[75] Inventor: Christian R. Sporck, Saratoga, Calif.

[73] Assignee: National Semiconductor Corporation, Santa Clara, Calif.

[21] Appl. No.: 567,724

[22] Filed: Apr. 14, 1975

Related U.S. Application Data

[63] Continuation-in-part of Ser. No. 353,458, April 23, 1973, Pat. No. 3,838,094, and Ser. No. 475,441, May 31, 1974, abandoned.

[51] Int. Cl.² ............................................. C08L 63/00
[52] U.S. Cl. ............................................. 260/37 EP
[58] Field of Search ..................... 260/37 EP, 2 EP; 106/308 N

[56] References Cited

U.S. PATENT DOCUMENTS

| | | | |
|---|---|---|---|
| 2,890,196 | 6/1959 | Phillips et al. | 260/2 EA X |
| 2,965,610 | 12/1960 | Newey | 260/2 EA X |
| 3,194,784 | 7/1965 | Bowen | 260/37 EP X |
| 3,290,165 | 12/1966 | Iannicelli | 160/308 N |
| 3,627,724 | 12/1971 | Lambert | 106/308 N X |
| 3,635,743 | 1/1972 | Smith | 106/308 N X |

Primary Examiner—Lewis T. Jacobs
Attorney, Agent, or Firm—Gail W. Woodward; Willis E. Higgins

[57] ABSTRACT

Casting composition for semiconductor devices composed of an aliphatic, preferably cycloaliphatic polyepoxide, a dicarboxylic acid anhydride, a catalyst and a finely ground fused silica which has been surface treated, e.g., with a silazane, to replace the hydrogens of silanol groups with hydrophobic groups.

7 Claims, 2 Drawing Figures

CASTING COMPOUND FOR SEMICONDUCTOR DEVICES

This application is a continuation-in-part of my co-pending application Ser. No. 353,458 entitled "Molding Composition and Molded Product", filed Apr. 23, 1973, now U.S. Pat. No. 3,838,094, and Ser. No. 475,441, filed May 31, 1974 entitled "Molding Composition and Molded Product" now abandoned.

In my co-pending applications referred to above, I describe a molding composition comprising an exploded novolac, a novolac, a catalyst and a surface-treated silica filler. The silica filler is a finely ground fused silica that is surface treated, for example, by means of a silazane to react with the silanol groups to substitute groups such as for hydroxyl groups. This has a favorable effect on electrical properties of the composition. For example, it is much less conductive and certain of the physical properties, such as flow properties, are advantageous, all as described in my aforesaid co-pending applications.

This molding composition is solid; during molding it is caused to melt by application of heat and it is forced under pressure into a mold containing the electrical device or devices which it is intended to encapsulate, such as lead frames having silicon semiconductor chips, lead wires, etc.

Figure 1:
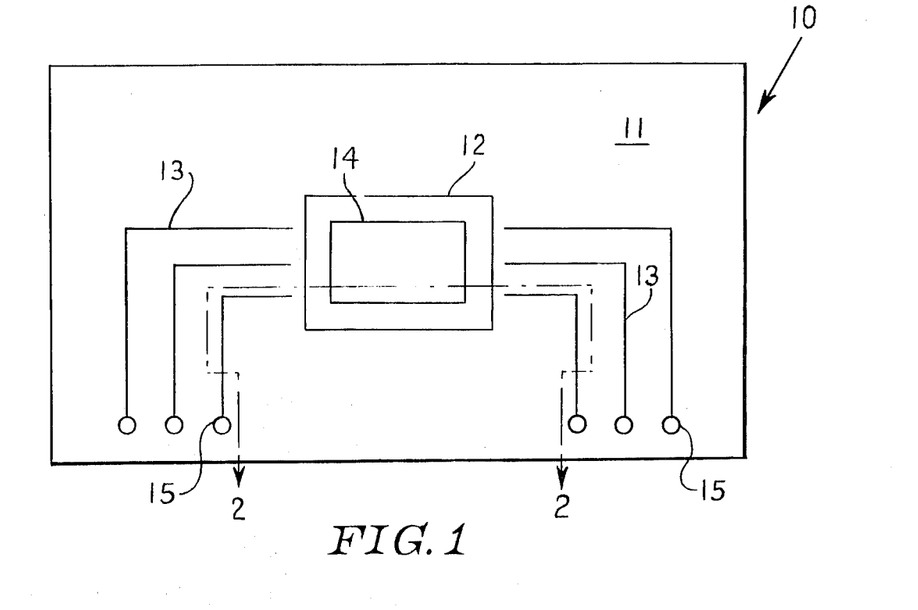
FIG. 1 is a plan view of a printed circuit board.
Figure 2:
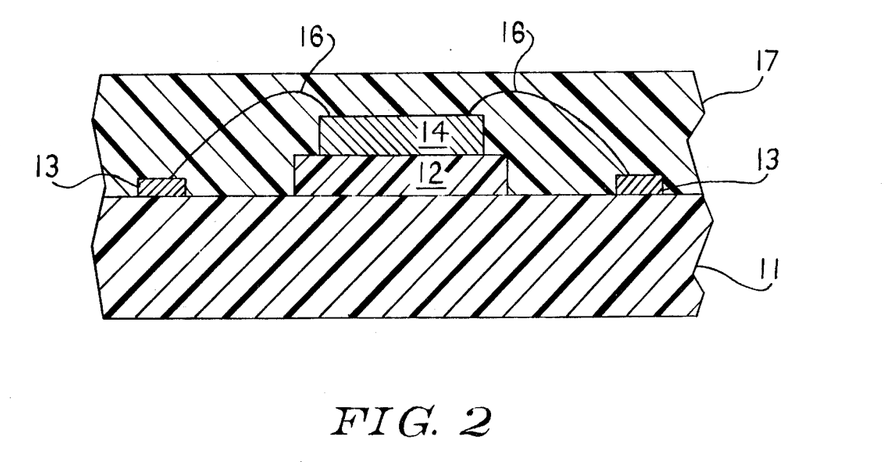
FIG. 2 is a fragmentary vertical section taken along the line 2—2 of FIG. 1, such figure being on an enlarged scale and showing the encapsulating material of the present invention as coating the upper surface of the board.

A typical electrical device in accordance with the present invention is described in Robert W. Beard and Robert B. Johnson, U.S. patent application Ser. No. 567,723, filed Apr. 14, 1975 and entitled "Electronic Device Configuration and Method of Making Same". Such a device is shown in the accompanying drawings, in which:

Referring to these figures, the device 10 includes a base 11 which may be conveniently made of a cured epoxy resin reinforced by glass fabric upon which are printed a pad 12 and traces 13 each of which is connected at one end to a terminal 15. Now shown in FIG. 1 are wires connecting the other ends of traces 13 to a semiconductor silicon chip 14 which is adhered to pad 12 by any suitable means such as a conductive epoxy resin and the application of pressure and heat. The pad 12 and traces 13 are conductive and are plated on base 11 by known techniques. The chip 14 is also made by well known techniques in the art of semiconductors.

Referring now to FIG. 2, one end of each trace 13 is connected by a very fine, e.g., about 0.001 inch diameter aluminum wire 16 having, typically, a coefficient of expansion (measured as described below) of about 20 to $22 \times 10^{-6}$ inch/inch/° C. The casting composition of the present invention is applied as a coating 17 to one surface (that having the components 12, 13, 14, 15 and 16) by, for example, extruding it through a small orifice and moving the device 10 to underneath the orifice. The thus coated device may then be completely encapsulated by a molding composition such as that described in my above-mentioned U.S. Pat. No. 3,838,094.

It will be understood that many different types of electrical devices including other semiconductor devices may be coated with the composition of the present invention; and it will be understood that many more traces such as those shown at 13 will ordinarily be present than are shown in FIGS. 1 and 2 together with as many aluminum connecting wires 16; that, each wire 16 connects to a particular area and function of the chip 14; that another chip, e.g., a driver chip, may be mounted on base 11 and may be connected to chip 14; and that connections between wires 16 and traces 13 may be made by known techniques such as ultrasonic welding or bonding.

It will suffice for purposes of the present invention to point out certain properties and requirements of the device which require certain properties of the coating composition 17. Thus the chip 14 is sensitive to moisture and to attack by ions, especially sodium and chloride ions; that the device as a whole is adversely affected by penetration to the electrically operative components of moisture; that the very thin aluminum wires 16 are very fragile and are incompatible with harsh treatment during coating; and that in applying (i.e., in casting) the coating material 17 it is necessary to do so at room temperature or at most at moderately elevated temperatures and to effect a complete cure within a short enough time to avoid damage to the device.

The coating composition, therefore, to meet such requirements must have a unique combination of properties such as high purity with reference to deleterious ions such as sodium and chloride ions and substances which are hydrophilic; it must be liquid at room temperature (20° -25° C) or moderately elevated temperatures (30° C to 40° C); its viscosity at such temperatures must be such that it will pour and spread evenly without running off the base 11 and without, on the other hand, congealing so quickly that it will not spread evenly; it should cure quickly at a moderate temperature (e.g., 110° to 130° C) to form a gel that is rigid enough to stay in place (i.e., to be dimensionally stable) until final cure; it should undergo final cure at acceptable temperatures, e.g., 145° to 175° C; and the cured coating should be highly hydrophobic, free of harmful quantities of deleterious ions such as sodium and chloride ions.

Such a unique combination of properties is achieved by the coating compositions of the present invention, but in electrical and other devices to be coated or encapsulated and which are not as demanding, greater tolerances and deviation from such optimum properties are permissible.

It is an object of the present invention to provide curable compositions having one, several or all of the properties described above.

It is a particular object of the present invention to provide casting compositions capable of coating electrical devices such as shown in FIGS. 1 and 2 which allow casting at relatively low temperatures, for example at room temperature or slightly above; which have a long pot life sufficient to meet the requirements of such encapsulating operations, for example holding a quantity of liquid casting composition for a period of ten hours or more before use without having it undergo undue polymerization and thickening; and which have rheological properties fitting them for such use and such that damage to to fragile components such as the aforementioned aluminum connecting wires does not occur due to different rates of expansion between such components and the casting compositions.

It is a further particular object of the invention to provide a casting composition of the character and for the purpose described which has a glass transition temperature ($T_g$), which is well above the temperature that the device is likely to encounter in used combined with a coefficient of expansion not greatly different from fragile components such as the aluminum connecting wires 16.

The above and other objects of the invention will be apparent from the ensuing description and the appended claims.

I have discovered that a casting composition of such character can be provided as follows: A monomer (or at most a low molecular weight oligomer) is provided which is an aliphatic, preferably a cycloaliphatic polyepoxide which can be represented as follows:

$$A\text{---}X\text{---}B \qquad \qquad \text{I}$$

wherein A and B are identical or dissimilar aliphatic groups, each of which contains at least one epoxide group; and X is a linking entity. The class of polyepoxides identified as 1 above is described more fully below. Preferably at least one of A and B is a cycloaliphatic group, either a six-membered ring (derived from cyclohexane) or a five-membered ring (derived from cyclopentane).

The casting composition of the present invention also contains a cross-linking agent in the form of a carboxylic acid anhydride

2 wherein R is preferably a cycloaliphatic or open chain aliphatic group but may be an aromatic group. This component 2 is elaborated below.

The composition also contains a catalyst, of which many examples are given below.

This composition also contains as an important ingredient a filler in the form of a surface-treated, finely-grounded, fused silica such as described in my above-mentioned co-pending applications and as described more fully below.

I have found that such compositions, when optimally prepared, possess a number of very desirable characteristics and properties such that they can be used as casting compositions to encapsulate or coat electrical devices such as the circuit board of FIGS. 1 and 2 that have delicate or sensitive components such as the aluminum connector wires 16 and the chip 14 and which have stringent electrical requirements such as very low conductivity of the coating medium and the necessity of maintaining proper functioning of the device for long periods of time at the somewhat elevated temperatures. Further, these compositions are significantly free of sodium and chloride ions which have a damaging effect on electrical devices of the character described and they are highly hydrophobic; they have compatible rheological properties at room or slightly elevated temperatures; and they have compatible coefficients of expansion and glass transition temperatures.

Thus the optimum composition of the present invention has a very long pot life at room temperature, e.g., a pot life of eight hours, such that they can be prepared in quantity in advance of use without premature curing and/or thickening. Further, such compositions are liquid at room temperature, therefore do not require heating and they can be cast rather than injected under pressure into a mold. This increases production speeds and reduces production costs. Further, these optimal compositions, when cast, can be cured at commercially acceptable rates and moderately elevated temperatures without undergoing expansion rates which differ widely from delicate components of the electrical device, such as the aluminum connector wires 16, thereby placing a strain on and breaking such fragile components. Further, the cured compositions have a glass transition temperature well above temperatures likely to be encountered in use. Glass transition temperature, $T_g$, is defined below.

The significance of glass transition temperature for purposes of the present invention is that, above this temperature the material undergoes expansion at a considerable rate with consequent stress and possible breakage of delicate components such as the aluminum wires 16. Further, the compositions of the present invention can be prepared such that when cured they have coefficients of expansion at temperatures below $T_g$ which are close to the coefficient of expansion of aluminum. This is advantageous because large differences in coefficients of expansion of the coating material and the wires 16 will lead to stress on the wires and fractures.

Choice of Aliphatic Polyepoxide

This component of the casting composition of the present invention may be chosen from a wide variety and a large number of substances (either single molecular species or mixtures of two or more molecular species) conforming to the formula 1.

$$A\text{---}X\text{---}B \qquad \qquad \text{I}$$

wherein X is the linking entity between the two epoxide bearing groups A and B, and A and B are selected from the class of open chain and cyclic (cycloaliphatic) aliphatic groups. A and B may be the same or different. Preferably at least one of A and B is a cyclohexyl or cyclopentyl group. For the specific purpose of encapsulating or coating an electrical device such as the printed circuit board of FIGS. 1 and 2, wherein there are delicate fragile components such as the connector wires 16 and wherein there is a silicon chip such as that shown at 14 in FIGS. 1 and 2 which is sensitive, it is important that the component 1 be of low molecular weight such that the casting composition is liquid at low temperature, for example, room temperature (about 20° to 25° C) and that the composition be free, except for unavoidable traces, of ionic impurities especially sodium and chloride ions which are the most likely to be present in a casting composition and which are among the most harmful to such devices. Both such ions impart an unduly high conductivity to the encapsulating or coating medium. Sodium ion adversely affects silicon chips and chloride ion adversely affects metal components. If the end use is not as demanding as that of a printed circuit board, as shown in FIGS. 1 and 2, such rigid requirements are not necessary, hence low molecular weight and high purity are not as important.

Examples of A, X and B, to be selected in the light of requirements and criteria mentioned above, are set forth below. Throughout, six-membered rings and five-membered rings are depicted as and it is to be understood that they are fully saturated rings, that is to say, rings derived by substitution of cyclohexane and cyclopentane, respectively. Unsaturation in these rings is permissible but confers no special benefit.

That is to say, A and B (selected to be identical or different) may be epoxidized cyclohexyl or cyclopentyl groups or an ethylene oxide group. The epoxide group may be exo or endo in the case of 5 and 6 and the valence bonds indicated may be attached at any of the numbered positions.

The carbocyclic rings of 5 and 6 may be substituted by one or more substituents R provided R is inert to the polymerizing and cross-linking reactions and is not harmful to or destructive of reagents used (for example, the catalyst) and/or to components of the end product such as the aluminum connecting wires and silicon chip. Ring substitution of 5 and 6 will, in many cases, increase the melting point and is to be used, if at all, with due regard to requirements as set forth above. Low molecular weight alkyl groups, such as methyl, can be employed if, for example, a precursor to 5 or 6 offers a practical alternative to cyclohexene (precursor of 5 or cyclopentene (precursor to 6). Examples of R are methyl, other low molecular weight alkyl, methoxy, other low molecular weight alkoxyl, etc.

The linking entity X may be any of a number of bivalent organic groups ranging widely in complexity from a simple methylene group, —CH₂—, to more complex groups such as ester groups

The subscripts $m$ and $n$ are zero or 1. Where $m$ or $n$ is 1, R₁ and/or R₂ are bivalent, essentially hydrocarbon groups, preferably of low molecular weight. X may be any other type of linking group consistent with the desiderata described above, such as low molecular weight and chemical inertness, and as will be apparent from the examples below, it may be a valence bond or A-X-B may be a single or fused ring substance having an epoxide group on two or more rings. In a case such as

($n = 0$ or an integer) the terminal ethylene oxide groups may be regarded as A and B and the linking group or valence bond between them as X.

Examples of X

—S—

—NH—

In the above, R₁ and R₂ are low molecular weight essentially hydrocarbon, e.g., alkyl groups; $m$ and $n$ are zero or an integer. In cases such as the last and second from last examples above, the formula of 1 may be generalized as follows:

A—(X)ₐ—B     I wherein a is zero or unity; if it is zero, then a single ring or fused ring component is intended and A and B are the two halves of such a ring system.

Examples of a (A-X-B) are set forth in Table I below.

Table I — Examples of 1 (A-X-B)

3,4-epoxycyclohexylmethyl-3,4-epoxycyclohexanecarboxylate; 3,4-epoxy-1-methylcyclohexylmethyl-3,4-epoxy-1-methylcyclohexanecarboxylate; 3,4-epoxy-3-methylcyclohexylmethyl-3,4-epoxy-2-methylcyclohexanecarboxylate; 3-methyl-1,5-pentanediol bis(3,4-epoxycyclohexanecarboxylate); 1,5-pentanediol bis (3,4,-epoxycyclohexanecarboxylate); 2-methoxymethyl-2,4-dimethyl-1,5-pentanediol bis(3,4-epoxycyclohexanecarboxylate); ethyleneglycol bis(3,4-epoxycyclohexanecarboxylate); 2,2-diethyl-1,3-propanediol bis(3,4-epoxycyclohexanecarboxylate); 2-butene-1,4-diol bis(3,4-epoxycyclohexanecarboxylate); 2-butene-1,4-diol bis(3,4-epoxy-6-methylcyclohexanecarboxylate); 1,1,1-trimethylolpropane tris(3,4-epoxycyclohexanecarboxylate); 1,2,3-propanetriol tris(3,4-epoxycyclohexanecarboxylate); dipropyleneglycol bis(2-ethylhexyl-4,5-epoxycyclohexane-1,2-dicarboxylate); diethyleneglycol bis(3,4-epoxy-6-methyl-cyclohexanecarboxylate); and triethylene glycol bis (3,4-epoxycyclohexanecarboxylate); bis(3,4-epoxybimethylcyclohexylmethyl)adipate; bis(3,4-epoxycyclohexylmethyl)oxalate; bis(3,4-epoxy-6-methylcyclohexylmethyl) sebacate; 3,9-bis(3,4-epoxycyclohexyl)spirobi (meta -dioxane); vinyl cyclohexene dioxide; bis (2,3-epoxycyclopentyl)ether; 2 - (3,4 - epoxycyclohexyl - 5 -5 spiro) (3,4 epoxy) cyclohexane - m -dioxane; cyclohexane dioxide; fused ring polyepoxides such as and asymmetric isomers;

whereas $n = 0, 1, 2, 3$ etc.

Choice of one of the above polyepoxides will, of course, be governed by the principles set forth above. For example, the last example of Table I (the spiro compound) results in a rather high viscosity, but it can be diluted with, for example, vinyl cyclohexene dioxide will reduce viscosity and is a reactive diluent. Further, in uses which will tolerate higher coating temperatures such more viscous products can be used. It will be understood, of course, that mixtures of two or more such polyepoxides can be used. Further, the term "poly" includes more than two epoxide groups in 1, subject to considerations of viscosity.

Choice of Anhydride 2

2

This involves a choice of R, which is limited only by considerations of end use. Where a casting composition capable of being poured at a higher temperature, for example 40° to 50° C is desired, and/or where a considerable range of viscosities at the casting temperature can be tolerated and where considerations of the fragility and electrical requirements of the product to be coated or encapsulated are not demanding, a wider choice of R is possible. Thus in such cases R may be an aromatic ring such as the benzene ring as in phthalic anhydride and homologues such as anhydrides derived from toluene, xylene and naphthalene. However, for purposes such as coating the circuit board of FIGS. 1 and 2, it is preferred that R be of low molecular weight and that it be cycloaliphatic as in hexahydrophthalic anhydride (HHPA) or open chain aliphatic such as succinic and citraconic anhydrides. Examples of suitable anhydrides are set forth in Table II below.

Table II
Anhydrides 2

Hexahydrophthalic anhydride
Succinic anhydride
Citraconic anhydride
Itaconic anhydride Alkenyl anhydrides =  (R = alkenyl)

Tricarballylic anhydride
Maleic anhydride
Linoleic adduct of maleic anhydride =

($R_1$ = n — hexyl)

Maleic anhydride adduct of methyl cyclopentadiene

Choice of Catalysts

Any catalyst which is operable to catalyze the polymerization and cross-linking reactions between 1 and 2 may be used. However, those catalysts are preferred which are free of ions that are detrimental to the structure and/or to the electrical functions of the article to be coated or encapsulated, such as the circuit board of FIGS. 1 and 2. As noted above, the ions of sodium and chlorine are quite deleterious and are to be avoided. Suitable ionic components of the catalyst are the divalent ions of zinc, tin, zirconium, lead and uranium. These are coupled, of course, with a suitable anion which should not be, for example, a chloride, but which may be any of a number of relatively long chain organic radicals having a suitable dispersing or solubilizing effect. Lewis acids are one class of preferred catalysts. Aluminum salts are also useful, e.g. aluminum acetylacetonate having the formula Another class of suitable catalysts are Lewis bases such as set forth below. Examples of Lewis acids are salts of the divalent metals above named and $C_4$ and $C_{20}$ saturated and unsaturated fatty acids, e.g., butyric, valeric, caproic, caprylic (octanoic), lauric, palmitic, stearic, oleic, linoleic and linolenic acids. Examples of Lewis bases are benzyl dimethyl amine, trimethylamine, benzyl diethyl amine and any other tertiary amines which are known to be effective for catalyzing such systems, also imidazoles such as 2-phenyl imidazole and any of those described in my U.S. Pat. No. 3,838,094.

Silica Filler

Finely ground fused silica is employed. Such form of silica is described in my above-mentioned U.S. Pat. No. 3,838,094 at column 5, line 42, to column 6, line 64 wherein this type of silica and its treatment are described in detail. Any fused silica of high purity and of the size range indicated is suitable provided its surface is treated to replace the hydroxyl hydrogen of all or substantially all of the silanol groups with hydrophobic groups. This can be illustrated as follows: Upon treatment of fused silica particles with a silazane as described in U.S. Pat. No. 3,838,094 ammonia is evolved and groups are converted to groups such as

Any reagent which will accomplish the replacement of hydroxyl hydrogen of silanol groups with hydrophobic groups will surface. In addition to silazanes, certain silanes may be used, for example ethyltriethoxysilane [EtSi(OEt)$_3$], amyltriethoxysilane, vinyl triethoxysilane; phenyl and methyl triethoxysilanes (all having the formula RSi(OC$_2$H$_5$)$_3$ where R = phenyl, methyl, etc.) R$_2$Si(OEt)$_2$ where R is as in the triethoxysilanes above. β-(3,4-epoxycyclohexyl) ethyltrimethoxysilane (having the formula and γglycidoxylpropyltrimethoxysilane having the formula The following specific examples will serve further to illustrate the practice and the advantages of the present invention. In these examples and for purposes of brevity symbols are used having the following meanings:

T$_g$ is the glass transition temperature determined as described below.

HPCT is hot plate cure time. This is further identified as time in minutes for cure on a hot plate at 170° C to a state wherein the composition first assumes a gel-like form such that it does not flow in the absence of applied pressure.

$\alpha_1$ is the expansion coefficient, the number indicated being multiplied by 10$^{-6}$/inch/inch/degree C below the T$_g$.

$\alpha_2$ is the expansion coefficient in the same units above T$_g$.

Both $\alpha_1$, $\alpha_2$ and T$_g$ are measured by the procedure described in a publication of Perkin Elmer Corp. entitled Instruction Model TMS-1, 219-0301, 117 volt, copyrighted 1969.

Epoxy I is 3,4-epoxycyclomethyl-3,4-epoxycyclohexane carboxylate

HHPA is hexahydrophthalic anhydride.

Filler 3 and Filler 7 are products of Glass Rock Products Co., further identified in Example 1 below.

Example 1-Surface Treatment of Fillers Nos. 3 and 7

The filller is a fused silica that has been ground to a fineness such that its size specifications are as follows:

| Particle size (in microns) | Percent through at- Minimum | Maximum |
|---|---|---|
| | Wet grind silica | |
| 20 | 94 | 100 |
| 10 | 77 | 91 |
| 5 | 55 | 70 |
| 2 | 30 | 48 |
| | Dry grind silica | |
| 20 | 73 | 99 |
| 10 | 41 | 74 |
| 5 | 19 | 40 |
| 2 | 4 | 16 |

(In the following examples, wet grind silica was used)

In the table above, the wet grind silica was a product of Glass Products, Inc. known as GP3I and the dry grind silica was also a product of Glass Products, Inc. known as GP7I.

The fused silica is treated with a silazane having in its molecule one or more of the groups IV:

IV

In partial Formula IV, the valences of the silicon atoms (other than those which are linked to a nitrogen atom) are satisfied by inert hydrocarbon groups, such as methyl, ethyl, etc. Examples of suitable silazanes are hexamethyl disilazane (IVA)

(CH$_3$)$_3$Si—NH—Si(CH$_3$)$_3$ and octamethyl cyclotetrasilizane

IVb and hexamethyl cyclotrisilazane; see structural formula in my U.S. Pat. No. 3,838,094. As will be apparent, the silazane IV may be an open chain or a cyclic compound. Also the methyl groups of the siliazanes IVa, IVb and IVc may be substituted by other hydrocarbon groups as explained above.

The fused silica is treated with a silazane (or with a mixture of silazanes) either dissolved in a volatile solvent, such as petroleum ether, which is removed after mixing with the silica by application of heat, or the mixing is carried out dry in suitable mixing equipment, such as Henschel or Lotige mixer which are known commercial mixers. The amount of silazane used may vary from about 0.5 to 2.0% of hexamethylsilazane (or equivalent amounts of other silizanes) based on the weight of fused silica. In any case, the entire silica surface should be coated uniformly with the silazane. The coated silica is then held for some time, for example for about 5 hours at a temperature of about 100° to 120° C to bring about completion of reactions and evolution of ammonia. It appears that adsorbed water on the silica particles is absorbed by or reacts with the silazane and is thereby removed and that silanol groups on the silica react with the silazane to substitute groups such as for hydroxyl groups. In any event, the surface-treated silica is beneficially modified. The surface properties of the silica filler are modified such that the silica contains no moisture or substantially no moisture and contains substantially no free silanol groups. Empirically, it has been found that this treated silica, although much more dense than water, will float on top of water because it is so free of hydrophilic matter that is not wetted.

EXAMPLE 2

A master batch (MB) was prepared as follows as a convenient way to incorporate the catalyst (parts in grams):

| Epoxy I | | 7.0 |
|---|---|---|
| BDMA | | 1.0 |
| Ethylene glycol | | 2.0 |
| | Total | 10.0 grams |

These ingredients were thoroughly blended, then mixed with the remainder as follows (parts in grams):

| Epoxy I | | 6.27 |
|---|---|---|
| MB | | 0.67 |
| HHPA | | 6.75 |
| Filler No. 3 | | 36.50 |
| | Total | 50.19 grams |

The filler was surface treated as described in Example 1 above employing Glass Products GP3I (Throughout these examples Filler No. 3 is Glass Products GP3I surface treated as in Example 1 and Filler No. 7 is surface treated Glass Products GP7I. Where the silica filler was untreated, it is so identified).

This mixture had a HPCT of 2 1/2 minutes at 170° C; $\alpha_1 = 18.5$, $\alpha_2 = 104$ and Tg = 173.

In each of the following examples where a master batch (MB) is indicated, it was prepared in accordance with the MB formula and was incorporated in the final product in the proportion indicated. All parts are grams.

EXAMPLE 3

| MB Formula | | Final Product | |
|---|---|---|---|
| Epoxy I | 50.00 | Filler No. 3 | 73.00 |
| Sn octanoate | 0.21 | MB | 17.08 |
| | | HHPA | 10.12 |

Note: Sn octanoate = Stannous octanoate $Sn(OOCC_7H_{15})_2$, herein after $Sn(Oct)_2$ HPCT  2¼ Min.

EXAMPLE 4

| MB Formula | | Final Product | |
|---|---|---|---|
| Epoxy I | 50.00 | Filler No. 3 | 73.00 |
| Zn salt of fatty acid | 0.25 | MB | 17.08 |
| Ethylene glycol | 0.10 | HHPA | 10.12 |

| HPCT | 2¼ |
|---|---|
| α1 | 24.9 |
| α2 | 82.3 |
| Tg | 142.0 |

EXAMPLE 5

| MB Formula | | Final Product | |
|---|---|---|---|
| Epoxy I | 7.0 | Epoxy I | 6.27 |
| BDMA | 0.5 | MB | 0.675 |
| Ethylene glycol | 2.0 | HHPA | 6.75 |
| | | Filler No. 3 | 36.50 |

BDMA = benzyl dimethylamine

| α1 | 17.9 |
|---|---|
| α2 | 116 |
| Tg | 170 |

EXAMPLE 6

| MB Formula | | Final Product | |
|---|---|---|---|
| Epoxy I | 25.00 | Filler No. 3 | 36.50 |
| Zn salt of fatty acid | 0.25 | MB | 8.54 |
| Ethylene glycol | 0.50 | HHPA | 5.06 |

| α1 | 23.4 |
|---|---|
| α2 | 110 |
| Tg | 160 |

EXAMPLE 7

| MB Formula | | Final Product | |
|---|---|---|---|
| Epoxy I | 4.0 | Epoxy I | 18.36 |
| Sn (Oct)₂ | 0.4 | HHPA | 10.77 |
| | | MB | 0.96 |
| | | Filler No. 3 | 77.28 |

| HPCT | 2 min., 54 Sec. |
|---|---|
| α1 | 25.3 |

| MB Formula | | Final Product |
|---|---|---|
| $\alpha 2$ | | 89 |
| Tg | | 119 |

EXAMPLE 8

In this example, four different mixtures (a), (b), (c) and (d) of Filler No. 3 and Epoxy I were prepared. Mixtures (a), (c) and (d) had 72%, 73% and 74% of Filler No. 3, respectively and mixture (b) had 72%. Filler No. 3 untreated. The purpose of these comparative examples was to investigate the effect of the quantity of filler on viscosity [(a), (c) and (d)] and the effect of surface treatment [(b) vs. (a), (c) and (d)]. Results were as follows.

|  | (a) 72% Filler No. 3 | (b) 72% Untreated Filler No. 3 |
|---|---|---|
| Initial Viscosity | 116,000 | 130,000 |
| Viscosity at 24 Hours | 137,000 | 276,000 |

|  | (c) 73% Filler No. 3 | (d) 74% Filler No. 3 |
|---|---|---|
| Initial Viscosity | 166,000 |  |
| Viscosity at 24 Hours | 168,000 | 236,000 |

Except in the case of (d), conditions were the same and in all cases the temperature was 23° C. In (d), the 24 hour viscosity the spindle speed in rpm was 1.5 while in (a), (b) and (c) it was 3.

EXAMPLE 9

| Part A | | Part B | |
|---|---|---|---|
| Filler No. 3 | 1839.60 | Filler No. 3 | 3066.00 |
| HHPA | 680.00 | Epoxy I | 1134.00 |
| Sn(Oct)₂ | 9.45 | Ethylene glycol | 22.68 |

The final product was made by mixing 10 parts by weight of Part A with 6 parts by weight of Part B.

| $\alpha 1$ | 18.3 |
|---|---|
| $\alpha 2$ | 65.0 |
| Tg | 160.0 |

Comparing Examples 7 and 9, the composition of Example 7 contained no ethylene glycol and as a consequence had a relatively high $\alpha_1$ (25.3) and a low Tg (114). As will be seen from Example 9, the inclusion of ethylene glycol resulted in a lower $\alpha_1$ (18.3) and a much higher Tg (160).

EXAMPLE 10

The formulation was 16 grams Epoxy I, 16 grams of commercially available HHPA containing a zinc or stannous soap and 68 grams of Filler No. 7. This mix (because of the coarser filler) was too thick to cast at room temperature but it could be cast at 50° C. A specimen cured at 160° C for ten minutes to give a product having $\alpha_1 = 25$, $T_g = 102°$ C. Further cure at 175° C gave a product having $\alpha_1 = 23$, $\alpha_2 = 70$ and $T_g = 113°$ C. Upon baking further at 175° C for six hours no change of these properties occurred.

EXAMPLE 11

The formulation was 954 grams of untreated Filler No. 3, 204 grams of HHPA with catalyst similar to that in Example 10. 204 grams Epoxy I and 6.81 grams carbon black to produce a black color. This was pourable at room temperature but over a period of time it became too thick to pour.

EXAMPLE 12

| Formula was as follows. | |
|---|---|
| Epoxy I | 75 |
| Epoxy II | 25 |
| HHPA | 51.7 |
| Sn (oct)₂ | 0.375 |
| Filler No. 3 | 418.2 |

Epoxy II was a mixture of cycloaliphatic polyepoxides and served as a plasticizer. This material gelled at 175° C in 1-½ minutes.

EXAMPLE 13

In this instance 14 grams of Epoxy I, 14 grams of a commercially available HHPA containing a zinc or stannous soap and 74 grams of FIller No. 3 had an HPCT at 170° C of 2-½ minutes, $\alpha_1 = 20$, $\alpha_2 = 67$, $T_g = 133°$ C after 6 hours cure at 175° C.

EXAMPLE 14

| A composition as follows: | |
|---|---|
| Epoxy I | 14 grams |
| Commercial HHPA containing zinc or stannous soap | 14 grams |
| Filler No. 3 | 72 grams | was poured onto 85 silicon semiconductor chips at room temperature and baked at 175° C for four hours. These and seventy similar chips without application of this coating material were encapsulated in a molding composition similar to that of U.S. Pat. No. 3,838,094 and by a procedure similar to that described in this patent. Then 85 devices (costed in accordance with the present invention) and 70 controls were tested as follows:

a. Some were treated with steam in an autoclave at 15 psig. Results at 95 hours showed one failure out of 27 units coated with the above formula and one out of 20 controls, failure being indicated by an open circuit.

b. Thirty-one chips coated with the above formula and thirty-one controls were subjected to a biased operating life test at 125° C, failure being indicated by an open circuit, a short or a change in voltage output greater than acceptable. Results were as follows: Of the thirty-two chips treated with the formula of the invention, two failed at 1000 hours, some at 500 hours. Of the 32 control chips one failed at 336 hours, six more at 500 hours and four more at 1000 hours.

EXAMPLE 15

Compositions (1) and (2) were prepared, No. (1) being catalyzed by an amine (BDMA) and No. 2 by a Lewis acid.

| MB Formula | Composition (1) | | Final Product | |
|---|---|---|---|---|
| Epoxy I | 7 | Epoxy I | 12.86 |
| BDMA | 1 | MB | 1.34 |
| Ethylene glycol | 2 | HHPA | 13.80 |
| | | Filler No. 3 | 72.00 |

Composition No. (2) was that of Example 14. These were used (separately to coat CMOS Type 4601 silicon chip devices and linear type 101 silicon chip devices. The devices were cured four hours at 175° C and were subjected to tests with results as follows:

| | 4601 Devices Steam Autoclave at 15 psi | |
|---|---|---|
| | 96 Hrs. | 192 Hrs. |
| Composition (1) (56 devices) | No failures | No failures |
| Composition (2) (52 devices) | 3 failures | No further failures |

| | 85° C/85% Relative Humidity Reverse Biased Test | | |
|---|---|---|---|
| | 168 | 500 | 856 Hrs. |
| (1) (30 devices) | No failures | No failures | 6 failures |
| (2) (30 devices) | 2 failures | 4 more failures | No more failures |

| | Biased Operating Life at 125° C | | |
|---|---|---|---|
| | 168 | 500 | 856 Hrs. |
| (1) (58 devices) | No failures | 1 failure | 1 more failure |
| (2) (57 devices) | One failure | One more failure | No more failures |

| | 101 Devices Operating Life at 125° C | | | |
|---|---|---|---|---|
| | 168 | 500 | 1000 Hrs. | |
| (1) (30 devices) | 0.073 | 0.401 | 0.21 | Average voltage input drift, millivolts |
| (2) (30 devices) | 0.097 | 0.164 | 0.10 | Average voltage input drift, millivolts |

| | 85° C/85% Relative Humidity Reverse Biased Test | | |
|---|---|---|---|
| | 168 | 500 | 1000 hrs. |
| (1) (33 devices) | No failure | One failure | 29 more failures |
| (2) (40 devices) | No failure | No failure | 12 failures |

EXAMPLE 16

Two compositions (1) and (2) were prepared as follows, one [No. (1)] containing 73% Filler No. 3, the other [No. (2)] containing 74% Filler No. 3.

| | (1) (73% Filler) | (2) (74% Filler) |
|---|---|---|
| Part A | | |
| Epoxy I | 1134 | 1092 |
| Filler No. 3 | 3066 | 3108 |
| Ethylene Glycol | 23.6 | 21.8 |
| Part B | | |
| Filler No. 3 | 1839.6 | 1864.8 |
| HHPA | 680.4 | 655.2 |
| Sn(oct)$_2$ | 9.45 | 9.45 |

Figures shown are in grams. In each case, Parts A and B were mixed in the proportions of 10 parts of A to 6 parts of B. The resulting products were held eight hours at 20° C ±1° C and viscosity measurements were made at hourly intervals. Viscosity changes are shown in Table III below.

TABLE III

| | No. (1) | No. (2) |
|---|---|---|
| Initial viscosity | 90,000 | 208,000 |
| Viscosity at 1 hour | 140,000 | 224,000 |
| Viscosity at 2 hours | 182,000 | 224,000 |
| Viscosity at 3 hours | 170,000 | 248,000 |
| Viscosity at 4 hours | 193,000 | 236,000 |
| Viscosity at 5 hours | 176,000 | 236,000 |
| Viscosity at 6 hours | 192,000 | 268,000 |
| Viscosity at 7 hours | 188,000 | 308,000 |
| Viscosity at 8 hours | 212,000 | 382,000 |

EXAMPLE 17 the composition of Example 14 was applied on p channel metal gate chips of a printed circuit board which was incorporated in an electronic calculator device which included a 9 digit LED (light emitting diode) display and a 9 digit LED driver. The coated chips were cured 1 hour at 115° C, then three hours at 150°. The device was subjected to temperature cycling between −25° C and 85° C for 400 cycles with a three minute dwell at each temperature extreme. Twenty devices were so tested and none failed. Seventeen devices were subjected to operating life test at 100° for 100 hours. No failures occurred. Ten devices were subjected to 85°/85% RH reversed bias test with no failures at 500 hours.

Some General Considerations

To achieve properties compatible with semiconductor devices such as that shown in FIGS. 1 and 2 and to ensure the possibility of pouring the composition onto the device so as to avoid the necessity of a mold, a number of variables may be manipulated to achieve the desired results. Thus the molecular weight (low) and structure of the epoxide 1 and the anhydride 2 may be chosen to achieve a desired viscosity at room temperature and speed and tightness of curing. The filler will be chosen and employed in an amount to provide proper viscosity at the casting temperature, e.g., room temperature; and the surface treatment described above will maintain this viscosity over a suitable period of time. Also by selection of epoxy and anhydride components and of the catalyst a long pot life can be achieved. As is apparent from Examples 8 and 16, the viscosity can be controlled by the amount of filler (a small increase in filler content increases viscosity considerably). A coarser filler such as No. 7 provides a greater viscosity. $T_g$ is important in that for a delicate device such as shown in FIGS. 1 and 2 it must be above anticipated temperatures during use. Preferably the coefficient of expansion below $T_g$ (i.e., $\alpha_1$) is close to that of any fragile component such as the aluminum wires 16. Cure preferably occurs for such devices at a temperature not greater than 150° C and within a period of time such that damage to the device does not occur. For example, aluminum wires 16 have a coefficient of expansion of about 21 and it will be seen from the examples that this can be closely matched by $\alpha_1$ of the cured coating composition.

I claim

1. A curable composition which is liquid at room temperature or at a slightly elevated temperature and which comprises a. a major proportion of a polyepoxide $$A-(X)_a-B$$

wherein A and B are selected from the class of (1) cycloaliphatic groups, (2) open chain aliphatic groups and (3) segments of a cycloaliphatic single ring or fused ring systems, A and B each containing an epoxide group, X is a linking entity selected from the class of a valence bond and an atom or group of atoms and a is unity except where A and B belong to group (3) in which case a is zero;

b. a cross-linking agent in the form of an anhydride of a polycarboxylic acid wherein R is a cycloaliphatic group, an open chain aliphatic group or an aromatic group c. a catalyst capable of promoting polymerizing and cross-linking of (a) and (b); and d. a filler in the form of a finely divided fused silica the surface of which has been treated with a substance to convert silanol groups to groups wherein the $R_3$'s are the same or different hydrocarbon groups said components (a) and (b) being present in amounts and proportions to enable the composition to cure at temperatures not greater than about 175° C, to a hard product;

said components (a), (b) and (d) being selected and their proportions being such that the composition is a pourable liquid at temperatures not greater than about 40° C and is free of significant quantities of chloride and sodium ions.

2. The composition of claim 1 wherein (a) is a cycloaliphatic polyepoxide in which at least one of A and B is a cycloaliphatic group.

3. The composition of claim 2 wherein A and B are cycloaliphatic groups and (b) is a cycloaliphatic dicarboxylic anhydride.

4. A composition as in claim 1 wherein both A and B are epoxidized cyclohexyl groups, (b) is hexahydrophthalic anhydride, (c) is selected from the class of (1) salts of a fatty acid and a divalent metal ion which constitutes a Lewis acid and (2) Lewis bases; and the filler (d) has a fineness and is present in a quantity such that the composition will adhere as a layer of substantial thickness when poured onto a solid surface at room temperature.

5. The composition of claim 1 wherein the $R_3$'s are methyl.

6. A casting composition suitable for use at a temperature not exceeding about 40° C to pour onto a flat semiconductor surface and to adhere to such surface at such temperature in substantial thickness, said composition having a fast hot plate cure at 170° C, being free of significant amounts of halide and alkali metal ions and when cured having a glass transition temperature substantially above 100° C and a coefficient of thermal expansion at temperatures below its glass transition temperature substantially less than 30, said composition comprising:

a. a curable mixture of a cycloaliphatic polyepoxide and an anhydride of a cycloaliphatic polycarboxylic acid in proportion such that on curing they copolymerize to a thermoset resin, b. a catalyst capable of catalyzing such copolymerization, said catalyst being free of alkali metal and halogen, and c. a silica filler constituting not less than about 70% of the weight of the composition, said silica filler being a finely ground fused silica surface treated with a silazane to eliminate free silanol groups on the surface of the silica and to replace such groups with groups wherein the $R_3$'s are the same or different lower alkyl groups.

7. The composition of claim 6 wherein:

1. the cycloaliphatic polyepoxide has the structure wherein X is a linking group and the six membered cycloaliphatic rings may be substituted by lower alkyl; and 2. the anhydride is hexahydrophthalic anhydride in which the six membered cycloaliphatic ring may be substituted by lower alkyl.

* * * * *